United States Patent [19]
Ono et al.

[11] Patent Number: 5,405,230
[45] Date of Patent: Apr. 11, 1995

[54] LOAD-LOCK UNIT AND WAFER TRANSFER SYSTEM

[75] Inventors: Hiroo Ono, Yamanashi; Tetsu Oosawa, Sagamihara; Teruo Asakawa, Yamanashi; Kenji Nebuka, Nirasaki, all of Japan

[73] Assignee: Tokyo Electron Limited, Tokyo, Japan

[21] Appl. No.: 857,831

[22] Filed: Mar. 26, 1992

[30] Foreign Application Priority Data

Mar. 26, 1991 [JP] Japan .................. 3-087524

[51] Int. Cl.6 .......................... H01L 21/00
[52] U.S. Cl. ................ 414/217; 414/936; 414/939; 414/225; 414/416; 414/757; 414/937; 901/47; 118/719; 356/400; 364/559
[58] Field of Search ............ 414/936, 937, 935, 938, 414/941, 754, 757, 783, 225, 416, 417, 217, 222; 901/47; 118/719, 729, 730, 500; 204/298.25; 356/400, 375; 340/674, 540; 364/559, 468; 250/561, 548

[56] References Cited

U.S. PATENT DOCUMENTS

| | | | |
|---|---|---|---|
| 4,457,664 | 7/1984 | Judell et al. ............... | 414/779 X |
| 4,553,069 | 11/1985 | Purser . | |
| 4,752,898 | 6/1988 | Koenig ...................... | 414/754 X |
| 4,769,523 | 9/1988 | Tanimoto et al. . | |
| 4,836,733 | 6/1989 | Hertel et al. ............... | 414/225 |
| 4,880,348 | 11/1989 | Baker et al. ............... | 414/754 X |
| 4,917,556 | 4/1990 | Stork et al. ............... | 414/222 X |
| 4,973,217 | 11/1990 | Engelbrecht ............. | 414/DIG. 2 X |
| 5,004,924 | 4/1991 | Imahashi . | |
| 5,054,991 | 10/1981 | Kato .......................... | 414/749 X |
| 5,102,280 | 4/1992 | Poduje et al. ............. | 414/257 X |

FOREIGN PATENT DOCUMENTS

| | | |
|---|---|---|
| 0242066 | 10/1987 | European Pat. Off. . |
| 0288233 | 10/1988 | European Pat. Off. . |
| 0313466 | 4/1989 | European Pat. Off. . |
| 164047 | 6/1989 | Japan ............ 414/DIG. 2 |
| 87546 | 3/1990 | Japan ............ 414/DIG. 2 |

*Primary Examiner*—Frank E. Werner
*Attorney, Agent, or Firm*—Oblon, Spivak, McClelland, Maier & Neustadt

[57] ABSTRACT

A load-lock unit is disposed between first and second atmospheres, stores a wafer transferred from the first atmosphere, is blocked off from the first atmosphere, is thereafter set in the same atmosphere as or a similar atmosphere to the second atmosphere, and is opened to communicate with the second atmosphere in order to transfer the wafer to the second atmosphere. The load-lock unit includes a load-lock chamber, a storing device, disposed in the load-lock chamber, for storing a plurality of wafers vertically at a gap, a holding mechanism for holding one of the plurality of wafers stored in the storing device, a rotating mechanism for rotating the wafer held by the holding mechanism, and an error detecting device for detecting the positional error of the center of the wafer and an orientation error of the wafer on the basis of data obtained by radiating light on the wafer which is rotating.

23 Claims, 12 Drawing Sheets

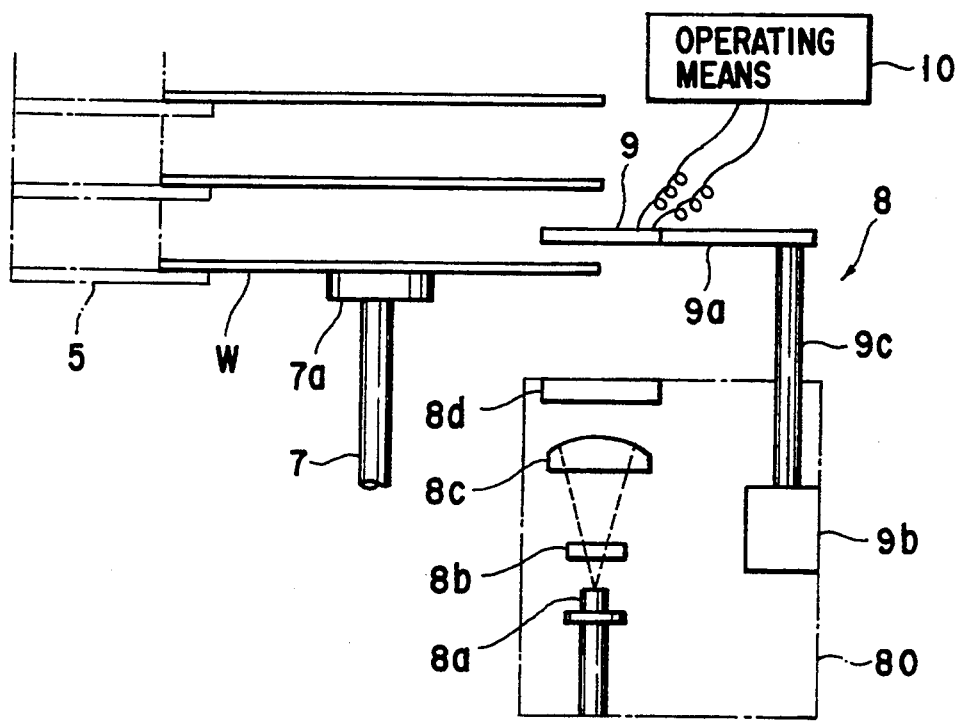
F I G. 4
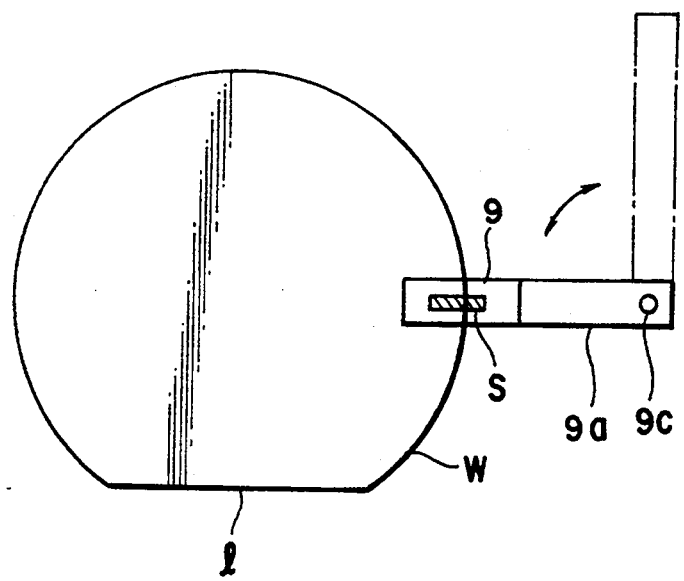
F I G. 5

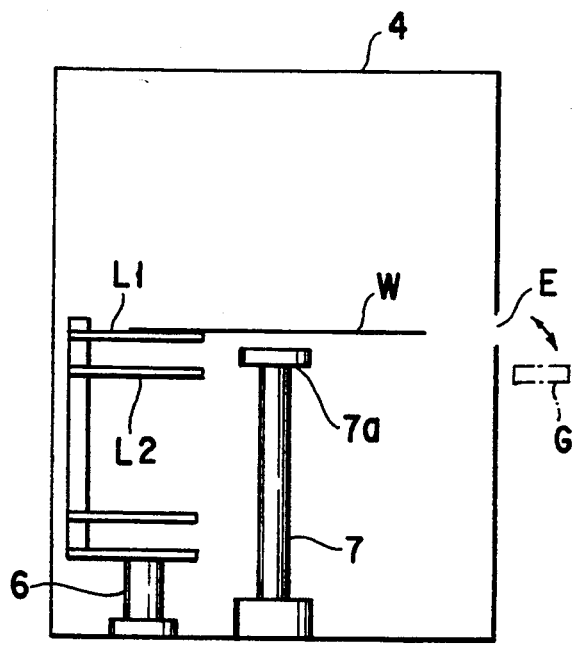
F I G. 6
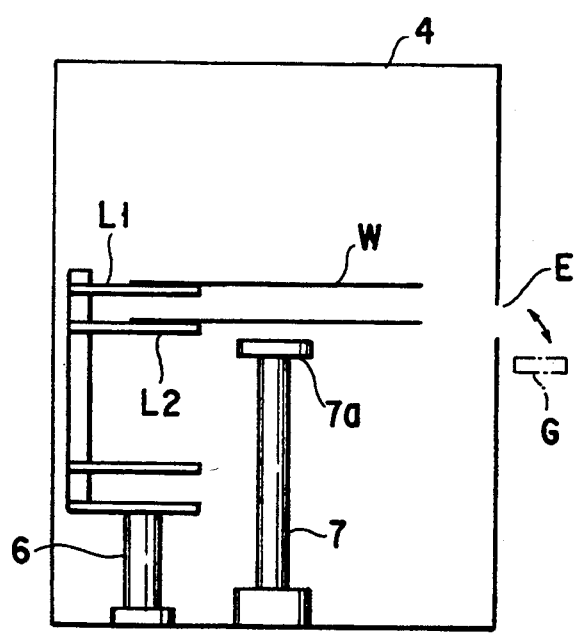
F I G. 7

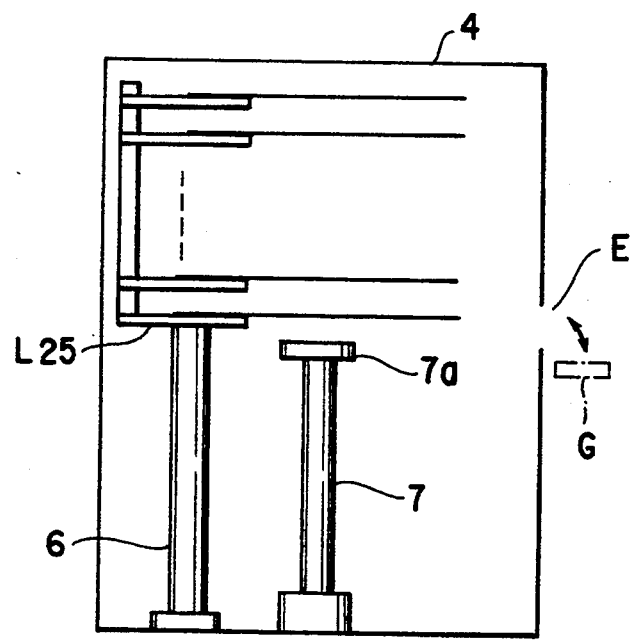
F I G. 8
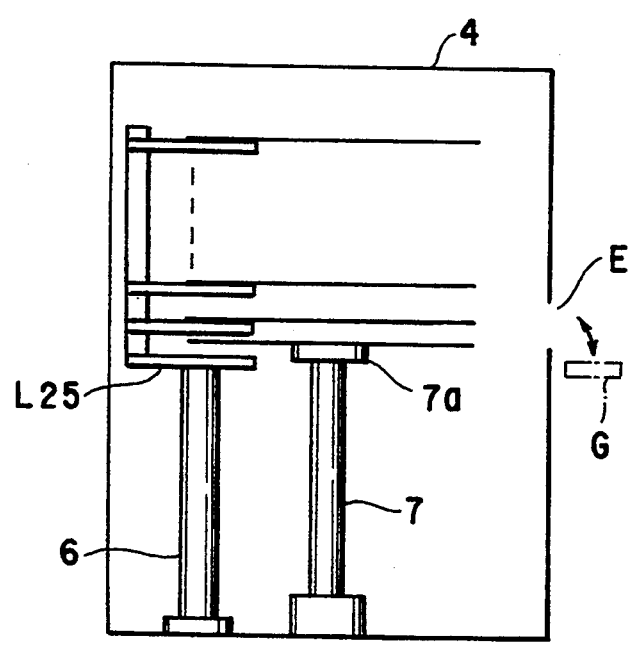
F I G. 9

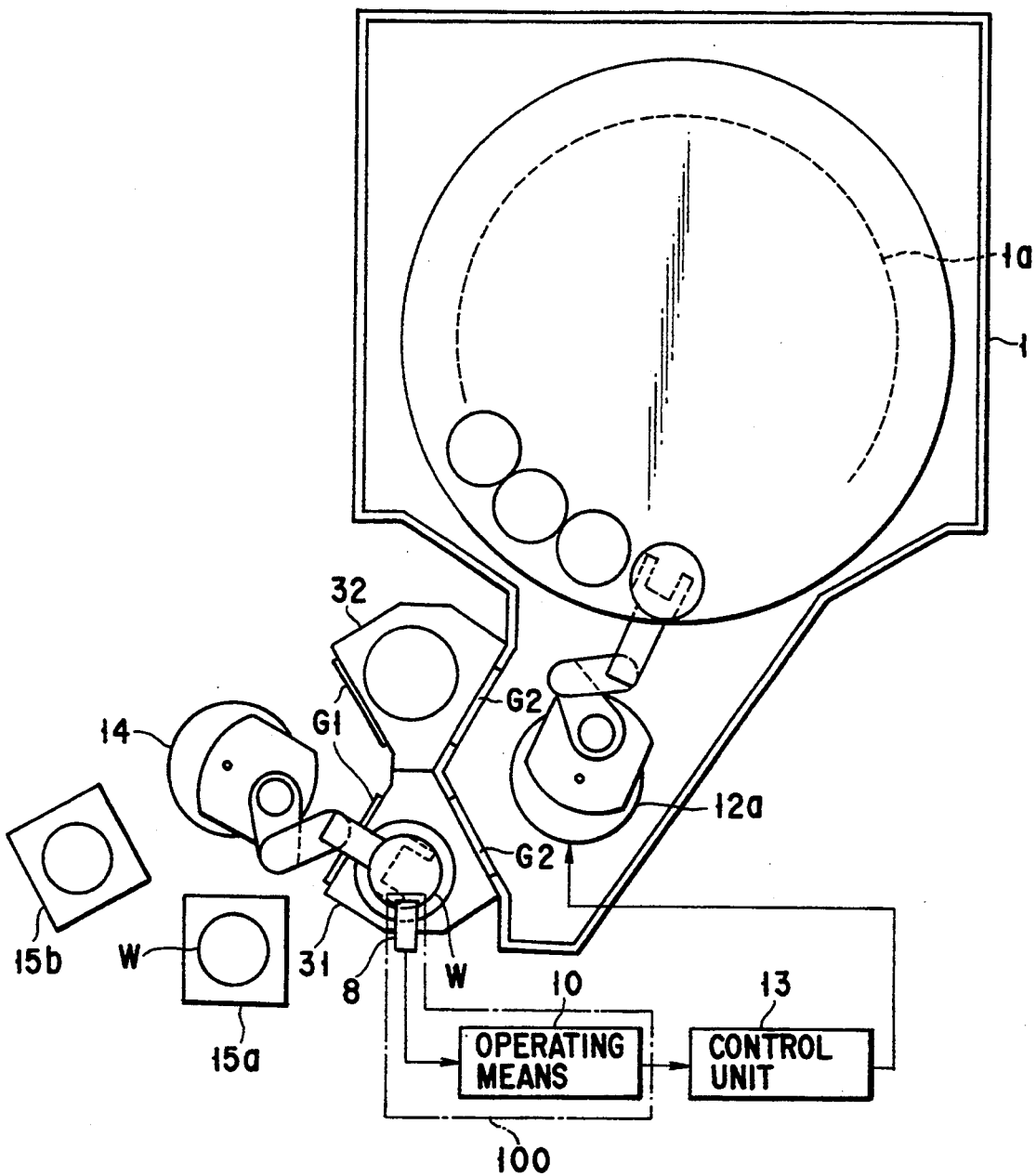
F I G. 12

LOAD-LOCK UNIT AND WAFER TRANSFER SYSTEM

BACKGROUND OF THE INVENTION

1. Field of the Invention

The present invention relates to a load-lock unit for transferring a wafer between atmospheres having different pressures, a wafer transfer system, and a wafer aligning unit.

2. Description of the Related Art

When a semiconductor wafer is to be transferred between a process chamber for processing a semiconductor wafer in a vacuum atmosphere and the outside (atmospheric pressure), a load-lock unit is used to improve the operation efficiency by shortening the time required for evacuation. With this load-lock unit, for example, to load the wafer in the process chamber from the outside, the wafer is first placed in a load-lock chamber, the interior of the load-lock chamber is evacuated to a predetermined pressure, the load-lock chamber is opened to communicate with the atmosphere in the process chamber, and then the wafer is loaded into the process chamber.

A semiconductor wafer has a crystal orientation. Thus, when a wafer is to be processed or tested, not only its central position but also its orientation or the direction of arrangement need be sometimes aligned.

For example, in an ion implantation unit, as shown in FIG. 1, ions generated by an ion generator I disposed in a terminal unit T are deflected by an analyzing magnet M and sequentially implanted in a wafer W on a turntable 1a (upright during ion implantation) in a process chamber through an acceleration tube A. Each wafer must be placed on the turntable 1a from the outside to be correctly aligned.

For this purpose, conventionally, as shown in FIG. 2, wafers W are transferred one by one to an aligning unit OD from a carrier 3 disposed at a predetermined position outside the process chamber 1 by a transfer robot R1 on the outer air side. The orientation error and a positional error of the center of each wafer are detected by the aligning unit OD, and two correcting steps for correction of the orientation and central position are performed to correct the errors, thus positioning the wafer W. Then, the wafer W in the aligning unit OD is transferred to a load-lock unit 2 by the transfer robot R1. The load-lock unit 2 is evacuated, and the wafer W is transferred to the turntable 1a from the load-lock unit 2 by a transfer robot R2 on the process chamber 1 side.

In such a conventional method, however, when the wafers are transferred into the load-lock unit one by one from the carrier, they must pass through the aligning unit, thus resulting in an increase in the number of times wafer handling is required. Thus, damage to the wafer tends to occur or particles of dust tend to attach the wafer, leading to a decrease in yield. At the same time, as the number of handling times is increased, the loading time is prolonged, decreasing the processing throughput of the load-lock unit.

Furthermore, it takes a long period of time to set the degree of vacuum of the interior of the load-lock unit close to that of the interior of the wafer process chamber after the former is decreased to a certain degree. This evacuation is performed for each of the wafers in the load-lock unit, and the throughput is decreased by this process as well.

Regarding the aligning unit, a servo mechanism for moving the wafer in X and Y directions is need to correct, e.g., the central position of the wafer. As a result, the aligning unit becomes complicated and costly and requires an additional installation space for the servo mechanism.

SUMMARY OF THE INVENTION

It is an object of the present invention to provide a compact load-lock unit which can increase the throughput and yield.

It is another object of the present invention to provide a wafer transfer system which can efficiently correct a positional error of a wafer.

It is still another object of the present invention to provide a wafer aligning unit which can efficiently correct a positional error of a plurality of wafers.

According to the present invention, there is provided a load-lock unit which is disposed between first and second atmospheres, stores a wafer transferred from the first atmosphere, is blocked off from the first atmosphere, is thereafter set in the same atmosphere as or a similar atmosphere as the second atmosphere, and is opened to communicate with the second atmosphere in order to transfer the wafer to the second atmosphere, comprising a load-lock chamber, storing means, disposed in the load-lock chamber, for storing a plurality of wafers vertically at a gap, holding means for holding one of the plurality of wafers stored in the storing means, rotating means for rotating the wafer held by the holding means, and error detecting means for detecting a positional error of the center of the wafer and an orientation error of the wafer on the basis of data obtained by radiating light on the wafer which is rotating.

According to the present invention, there is also provided a transfer system comprising a load-lock unit which is disposed between first and second atmospheres, stores a wafer transferred from the first atmosphere, is blocked off from the first atmosphere, is thereafter set in the same atmosphere as or a similar atmosphere to the second atmosphere, and is opened to communicate with the second atmosphere in order to transfer the wafer to the second atmosphere, transfer means for transferring the wafer in the load-lock unit to a predetermined position in the second atmosphere, and control means for controlling the transfer means, the load-lock unit comprising a load-lock chamber, storing means, disposed in the load-lock chamber, for storing a plurality of wafers vertically at a gap, holding means for holding one of the plurality of wafers stored in the storing means, rotating means for rotating the wafer held by the holding means, and error detecting means for detecting a positional error of the center of the wafer and an orientation error of the wafer on the basis of data obtained by radiating light on the wafer which is rotating, and the control means controlling the transfer means so that the wafer is disposed at the predetermined position in the second atmosphere after the positional error of the center thereof and the orientation error thereof are corrected on the basis of data from the error detecting means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a view showing an arrangement of an optical unit of the load-lock unit shown in FIG. 3;

FIG. 5 is a view showing the positional relationship between a light-receiving section of the optical unit shown in FIG. 4 and a wafer;

FIGS. 6 to 9 are views for explaining an operation of the load-lock unit shown in FIG. 3;

FIG. 12 is a view showing a transfer system according to another embodiment of the present invention;

DESCRIPTION OF THE PREFERRED EMBODIMENTS

The preferred embodiments of the present invention will be described with reference to the accompanying drawings.

Figure 3:
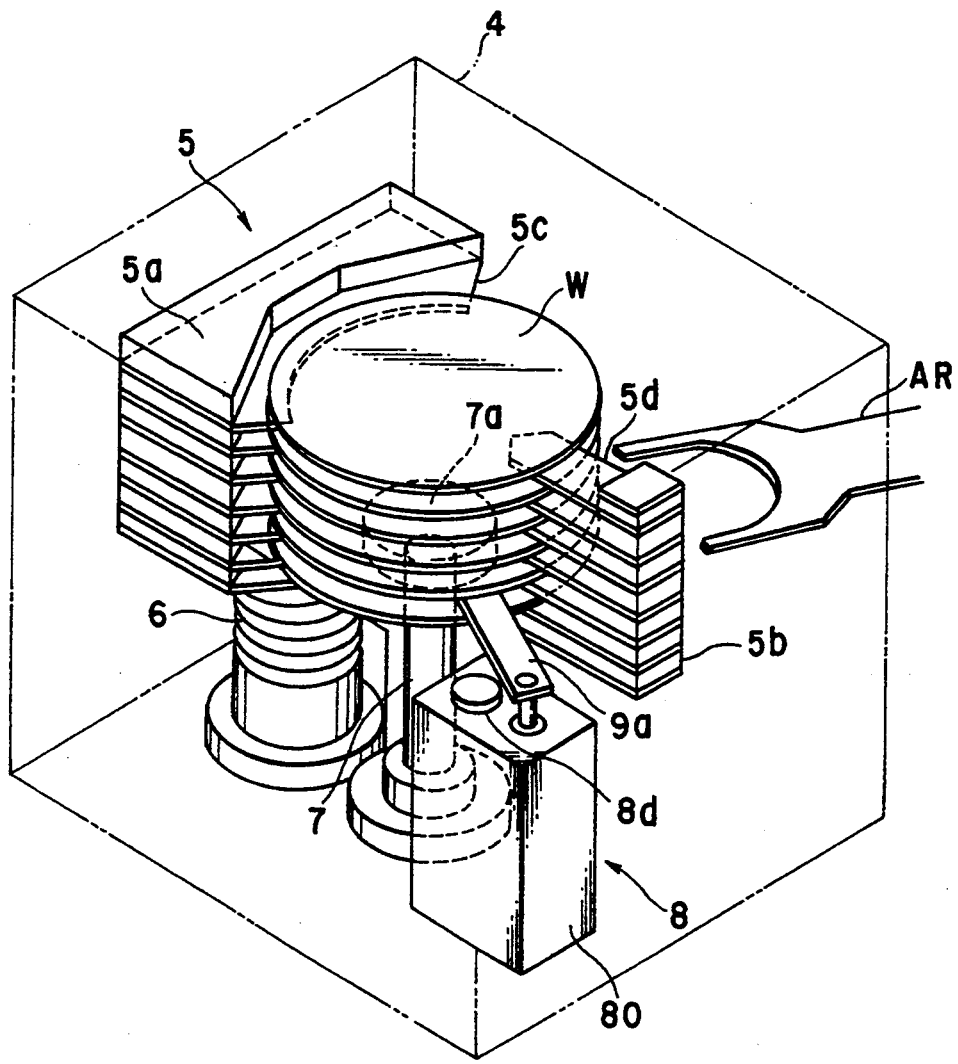
FIG. 3 is a perspective view showing a load-lock unit according to an embodiment of the present invention.

FIG. 3 shows an internal structure of a load-lock chamber 4 of a load-lock unit according to an embodiment of the present invention. In the load-lock unit of this embodiment, a wafer carrier 5 houses, e.g., 25 wafers W (only 6 wafers being shown in FIG. 3 for the sake of simplicity) such that they are stacked with gaps between each other. The lower surface of the wafer carrier 5 is connected to the upper end portion of a bellows 6 constituting an elevating mechanism which is extendible in the vertical direction.

Figure 1:
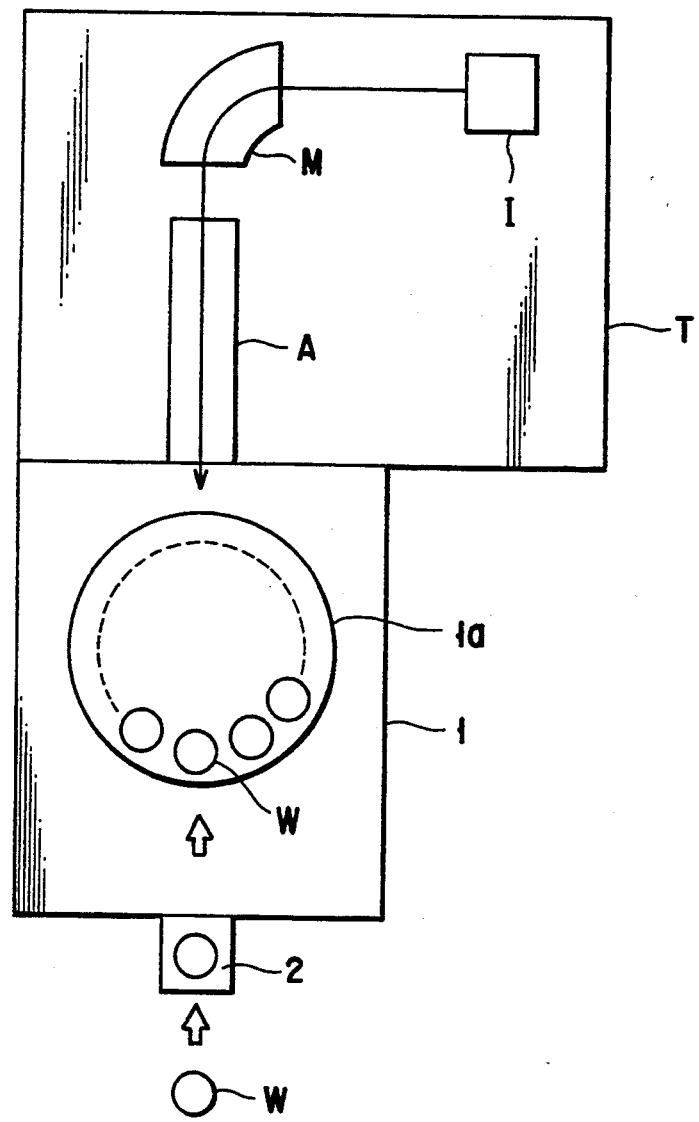
FIG. 1 is a view showing an overall arrangement of a conventional ion implantation unit.
Figure 2:
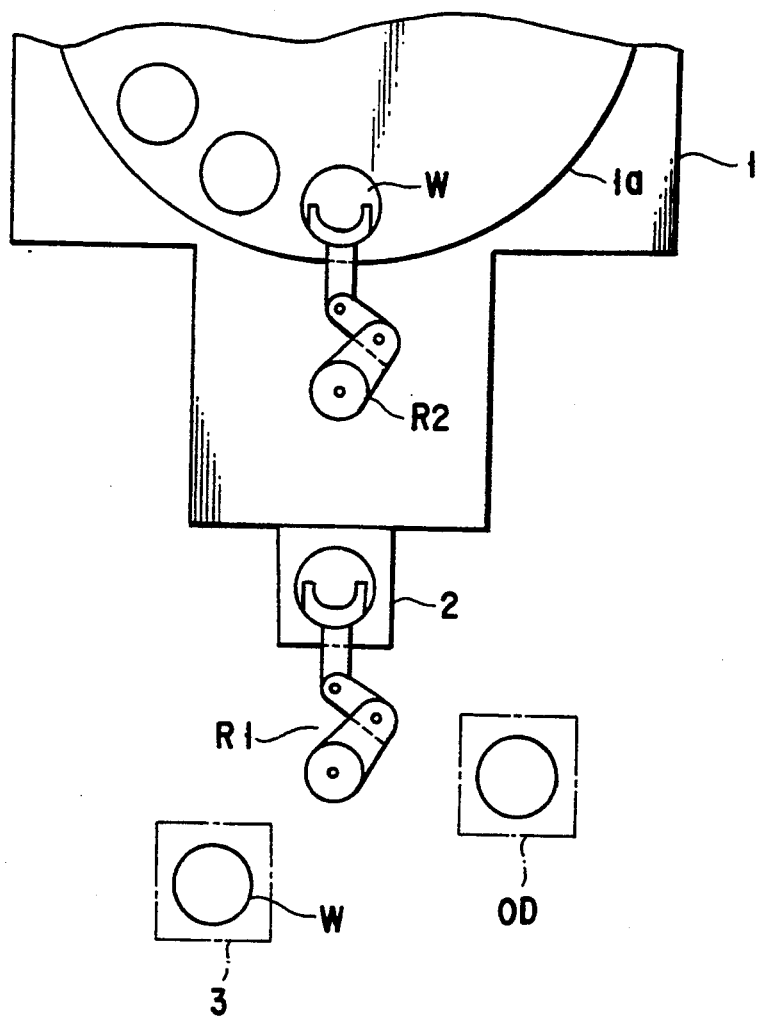
FIG. 2 is a view showing a conventional wafer transfer system of the ion implantation unit.

The wafer carrier 5 includes a first receiving section 5a located on the left side of FIG. 1 and having arched receiving plate members 5c and a second receiving section 5b opposing the first receiving section 5a and having tongue-shaped receiving plate members 5d. The first and second receiving sections 5a and 5b support the two sides of the wafer W. The first and second receiving sections 5a and 5b are coupled to each other at their lower portions through a coupling plate (not shown) whose central portion is notched so that the first and second receiving sections will not collide with a turntable (to be described later) when the coupling plate is vertically moved.

The wafer carrier 5 has the above arrangement so that the wafer W can be stored in or taken out from the chamber 4 by an arm on the outer air side and an arm on the process chamber side (indicated by reference symbol AR in FIG. 3).

A moving mechanism (not shown) using, e.g., a ball screw is provided in the bellows 6 (set at the atmospheric pressure). When the screw shaft is rotated by a motor, the wafer carrier 5 can be vertically moved with a high precision. Accordingly, the wafer carrier 5 is vertically moved by this moving mechanism (not shown) to correspond to the respective processes to be described later.

Below the wafers W stored in the wafer carrier 5, a rotating shaft 7 serving as a rotary mechanism rotated by a motor (not shown) about a vertical axis is mounted on the bottom surface of the load-lock chamber 4. A turntable 7a is provided on the upper end of the rotating shaft 7. A chucking means for electrostatically chucking the lower surface of the wafer W is incorporated in the turntable 7a. In the arrangement of FIG. 3, the turntable 7a and the chucking means constitute a holding section for the wafer W.

An optical unit 8 for optically obtaining a distance between the center of rotation and the periphery of the wafer W held on the turntable 7a is provided in the load-lock chamber 4.

The arrangement of the optical unit 8 will be described with reference to FIGS. 4 and 5.

A laser light source 8a, two cylindrical lenses 8b and 8c, and a window 8d constituted by, e.g., a glass plate are arranged in a box member 80 held at the atmospheric pressure. With this optical system, light emitted from, e.g., the laser light source 8a is shaped by the cylindrical lenses 8b and 8c into, e.g., a thin slit beam S extending in the radial direction of the wafer W and is radiated on the lower surface of the wafer W through the window 8d.

The slit beam S is set such that its middle point in the longitudinal direction is located on the periphery (excluding a linear portion 1 called an orientation flat) of the wafer W when the center and the center of rotation of the wafer W coincide with each other.

A light-receiving section 9 for receiving the laser beam is mounted on the distal end of a pivotal rod 9a on the upper surface side (upper side) of the wafer W on the turntable 7a.

The light-receiving section 9 is connected to an operating means 10 outside the load-lock chamber 4. The operating means 10 calculates a positional error amount of the wafer W in the load-lock chamber 4, i.e., the error amount in central position and orientation (rotation angle) of the wafer W on the basis of an electrical signal corresponding to a light amount received by the light-receiving section 9. The proximal end of the pivotal rod 9a is fixed to a pivotal shaft 9c which is pivoted by a drive section 9b about a vertical axis. When a positional error of the wafer W is to be detected, the pivotal rod 9a is inserted between a wafer as a detection target and a wafer above it (a detection position indicated by a solid line in FIG. 5). Other than this, the pivotal shaft 9c is rotated as indicated by an arrow in FIG. 5 to be disposed at a position (a retracted position indicated by a broken line in FIG. 5) not planarly interfering with the wafer W so as not to interfere with the vertical movement of the wafer W. The pivotal shaft 9c extends from the interior of the box member 80 held under at the atmospheric pressure into the load-lock unit under a vacuum atmosphere. The atmospheric pressure and the vacuum atmosphere can be sealed from each other by a magnetic seal.

The load-lock unit according to this embodiment has the arrangement as described above.

Operation of the above load-lock unit will not be described with reference to FIGS. 6 to 9.

It is first assumed that the wafer carrier 5 in the load-lock chamber 4 is empty and that a wafer is to be stored in the wafer carrier 5 from the outside (at atmospheric pressure). First, as shown in FIG. 6, the wafer carrier 5 is moved downward to a position where a 1st-level receiving section L1 (first from the top) is located slightly above the turntable 7a. A gate G is opened, and a wafer W is loaded in the load-lock chamber 4 by a transfer arm (not shown; corresponding to reference symbol AR in FIG. 3) through an outlet port E and placed on the 1st-level receiving section L1. Subsequently, the wafer carrier 5 is moved upward and stopped at a position where a 2nd-level receiving section (second from the top) L2 is located slightly above the turntable 7a, as shown in FIG. 7. A subsequent wafer is loaded from the outlet port E and placed on the 2nd-level receiving section L2 in the same manner.

This operation is repeated to sequentially move the wafer carrier 5 upward, thereby storing, e.g., 25 wafers as shown in FIG. 8.

Thereafter, the gate G is closed and the interior of the load-lock chamber 4 is evacuated to a predetermined vacuum degree. The wafer carrier 5 is moved downward so that a 25th-level receiving section L25 at the lowest level is located slightly above the upper surface of the turntable 7a. As a result, the wafer W placed on the 25th-level receiving section L25 is transferred to the turntable 7a, as shown in FIG. 7, and is chucked, e.g., electrostatically.

Subsequently, the pivotal rod 9a of the optical unit 8 shown in FIG. 5 is pivoted to insert the light-receiving section 9 between the wafers, so that the light-receiving section 9 is located at a position to receive the slit beam S. While the laser beam is radiated from the laser light source 8a onto the periphery of the wafer W, the wafer W is rotated through $360° + \alpha$, e.g., 365°, and the amount of received light is measured by the light-receiving section 9. An amount of laser beam received by the light-receiving section 9 corresponds to the position of the periphery of the wafer W in the slit beam range. Thus, the distance from the center of rotation to the periphery of the wafer W within the slit beam range at each angular position (angle) can be obtained by the operating means 10 on the basis of an electrical signal output from the light-receiving section 9. The orientation flat portion 1 for determining the crystal orientation is formed in the wafer W. Therefore, the amount the wafer W is off center from a correct position and the amount of error (error amount in rotation angle) as to the orientation of the wafer W from a correct position can be simultaneously detected by obtaining the distance between the center of rotation and the periphery of the wafer within the slit beam range corresponding to each angular position of the wafer W. The positional error of the center of the wafer W need not be that from the correct position but can instead be a distance from a certain reference point, and the error in rotation angle can be an angle of the orientation flat portion with respect to a certain reference line.

When a positional error of the wafer W is detected in this manner, the light-receiving section 9 is moved to the retracted position. Simultaneously, electrostatic chucking is released, the wafer carrier 5 is moved upward to lift the wafer W on the turntable 7a by the 25th-level receiving section L25, and the wafer W is stopped at a position of a predetermined level. That is, the wafer carrier 5 is stopped at the position shown in FIG. 8. Thereafter, the gate on the process chamber side is opened, and the wafer W is transferred into the process chamber by a transfer arm (not shown) through an inlet port (not shown, located at the same level as the outlet port E). Regarding the wafer in the wafer carrier 5 on the second level from the bottom, i.e., on a 24th-level receiving section, its positional error is detected by the same operation. The positional errors of the wafers W in the wafer carrier 5 are detected in this manner sequentially from the bottom and are loaded in the process chamber.

When the wafer stored in the wafer carrier 5 is to be loaded/unloaded by the transfer arm, if the wafer and the transfer arm interfere with each other at the same level, the transfer arm causes the wafer to drop from the wafer carrier 5. In order to prevent this, e.g., the method shown in FIG. 10 can be employed for controlling the stop position of the wafer carrier 5.

Figure 10:
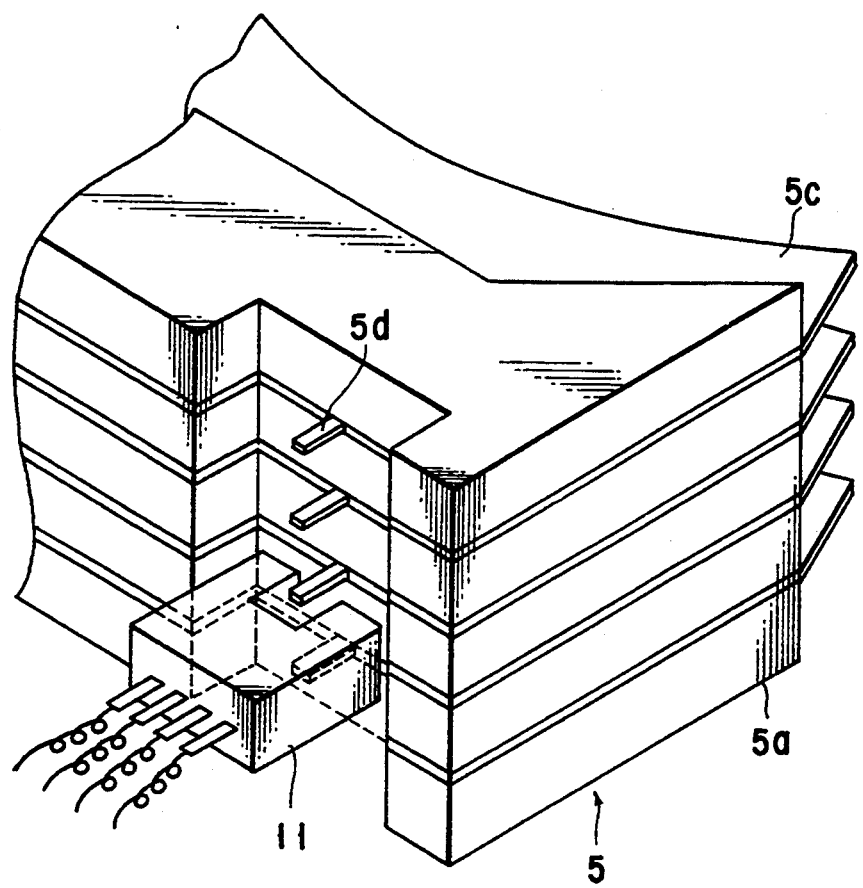
FIG. 10 is a perspective view showing a method of controlling a stopping position of a wafer carrier.

According to the arrangement shown in FIG. 10, in the first receiving section 5a (refer to FIG. 3) of the wafer carrier 5, a projection 5d serving as a shutter is provided to each receiving plate member 5c on which the wafer is to be placed, and a photosensor 11 having light-emitting and light-receiving sections 11a and 11b is provided to sandwich the movement path of each projection 5d. When the projection 5d blocks off the optical path of the photosensor 11 by the vertical movement of the wafer carrier 5, the wafer carrier 5 is stopped by a detection signal sent from the photosensor 11.

In this arrangement, since the projection 5d serving as an object to be detected and the receiving plate member 5c are integrally formed, position detection with high precision can be performed with a simple structure by directly detecting the position of the receiving plate member 5c.

If the wafer carrier 5 and the turntable 7b are disposed so as not to planarly interfere with each other, the wafer carrier 5 is vertically moved to transfer and receive the wafer, and the loading/unloading level of the wafer is set constant, as in the above embodiment, and a transfer mechanism which does not move in the vertical direction can be used.

Figure 11:
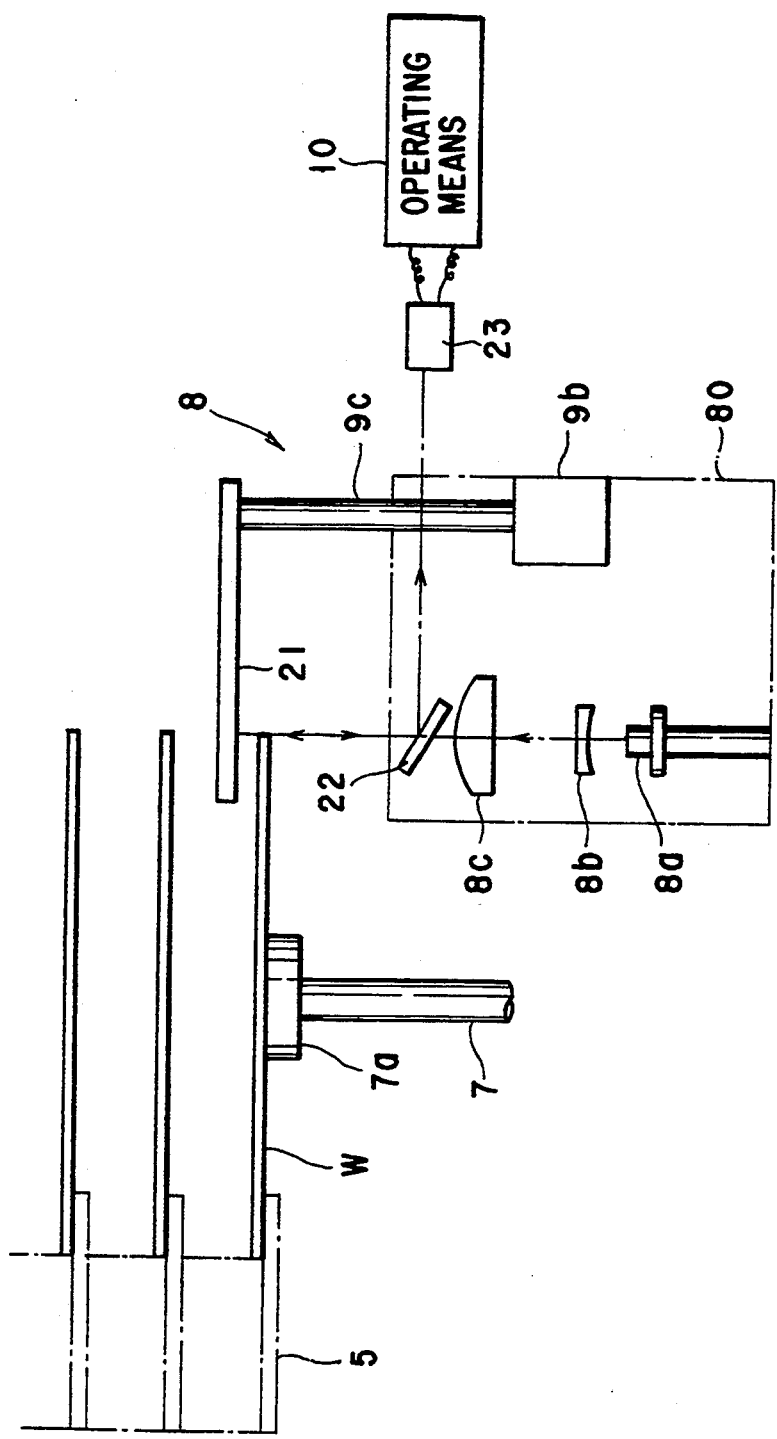
FIG. 11 is a view showing another arrangement of the light-receiving section of the optical unit.

In the load-lock unit described above, the amount of received laser beam which has passed through the periphery of the wafer is detected. However, as shown in FIG. 11, a mirror 21 may be disposed at a position of the light-receiving section 9 of FIG. 4, a half mirror 22 may be disposed in the optical path of the laser beam, and the laser beam reflected by the mirror 21 and the half mirror 22 may be received by a sensor 23. With this arrangement, the sensor can be arranged outside the load-lock unit which is to be set in vacuum atmosphere.

It is possible to detect the beam reflected by the lower surface of the wafer W.

The whole optical system can be translated in place of pivoting the light-receiving section shown in FIG. 4.

The positional error of the center of the wafer and an error in rotation angle of the wafer can be detected in the load-lock unit in the manner as described above. In order to correct the positional error of the center of the wafer and the error in rotation angle of the wafer which are thus detected, e.g., an aligning mechanism (not shown) may be incorporated in the load-lock unit, and the amount of error may be corrected by the aligning mechanism. Alternatively, the amount of error may be corrected while the wafer is transferred to the process chamber from the load-lock unit, as will be described below. The error in rotation angle may be corrected by the rotating shaft 7 of the load-lock unit, and the positional error of the center of the wafer may be corrected while the wafer is transferred to the process chamber from the load-lock unit. Correction of the error in rotation angle of the wafer by the rotating shaft 7 of the load-lock unit can be performed either during evacuation of the load-lock unit after the wafer is loaded in the load-lock unit, or during unloading of the wafer from the load-lock unit.

In detection of the positional error of the center of the wafer, the wafer W is rotated not through 360° but instead 360°+α, e.g., 365° due to the following reason. That is, if a starting point of data detection is near the vertex of the orientation flat of the wafer, the peak of the detection data (distance of wafer eccentricity) corresponding to the vertex of the orientation flat appears at two ends of the detection data, and thus these peaks cannot sometimes be regarded as peaks. Then, accurate error detection cannot be performed. Hence, the wafer W is rotated through 360°+α so that a peak can be clearly recognized in any case.

FIG. 12 shows part of a transfer system for transferring a wafer to a turntable 1a in a process chamber 1 of an ion implantation unit from the outside (atmospheric pressure). In this system, first and second load-lock units 31 and 32 each having the same arrangement as that shown in FIG. 3 are disposed.

A transfer mechanism 12a comprising, e.g., an articulated robot is provided in the process chamber 1. A control unit 13 for controlling the transfer mechanism 12a on the basis of an operation result is connected to the output of an operating means 10. Reference numeral 14 denotes a transfer mechanism on the outer air side; and 15a and 15b are wafer carriers disposed at predetermined positions.

Operation of the system shown in FIG. 12 will now be described. The non-processed wafers W, e.g., 25 wafers W buffered in the carrier 15a or 15b disposed in the outer air are loaded one by one in the first load-lock unit 31 by the transfer mechanism 14 through a gate G1 on the outer air side. The gate G1 is closed, and the load-lock unit 31 is evacuated. A gate G2 on the process chamber 1 is opened, and while the wafer W is rotated as described above, a laser beam is radiated on the periphery of the wafer W and light reflected by the periphery of the wafer W is received. The positional error of the wafer W is detected by the operating means 10 on the basis of an electrical signal from an optical unit 8. The wafers W are sequentially transferred to predetermined positions on the turntable 1a by the transfer mechanism 12a. At this time, the control unit 13 supplies a control signal to the transfer mechanism 12a so that the positional error of the center and the error in rotation angle of each wafer W occurring in the load-lock unit 31 are corrected on the basis of the operation result (i.e., the positional error amount of the wafer) supplied from the operating means 10 when the wafer W is placed at the predetermined position on the turntable 1a. In this embodiment, the optical unit 8 and the operating means 10 constitute a positional error detecting means 100.

Regarding control of the transfer mechanism 12a, the positional error amount may be corrected when the transfer mechanism 12a is to receive the wafer W in the load-lock unit 31 or is to place the wafer W on the turntable 1a, or in a process after the transfer mechanism 12a receives the wafer W and before the transfer mechanism 12a is to place the wafer W.

Regarding correction of the positional error detected in the load-lock unit, the error in rotation angle of the wafer W may be corrected by the rotating shaft 7 in the load-lock unit, and only the positional error of the center of the wafer W may be corrected by the transfer mechanism 12a.

Since the system shown in FIG. 12 has two load-lock units, while a wafer W is being loaded from one load-lock unit 31 or 32 in the process chamber 1, another wafer W can be loaded from a wafer carrier in the atmosphere in the other load-lock unit 31 or 32. Then, a wait time for alignment can be eliminated to increase the throughput.

Alignment can be performed while the former wafer is loaded on the disk by a vacuum arm. For that reason, a wait time for alignment can be apparently eliminated.

Figure 13:
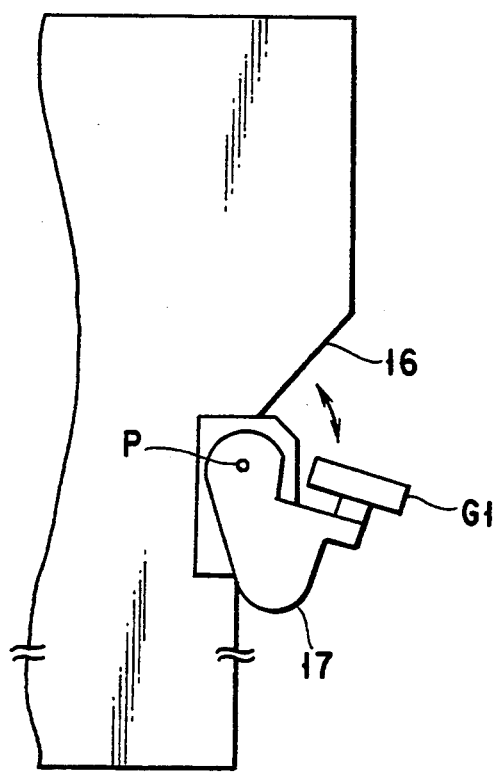
FIG. 13 is a sectional view showing an arrangement of part of the load-lock unit shown in FIG. 3.

Regarding the gate G1 of each of the load-lock units 31 and 32, if the wafer inlet port is formed to have a surface 16 inclined at, e.g., 45° with respect to the vertical axis, and the gate G1 for opening and closing the inlet port is provided with a pivotal member 17 which pivots about a horizontal axis P, as shown in FIG. 13, the movement path of the gate G1 will not be widened in the transverse direction, and its movement distance can be minimized, thus minimizing the installation space. In this case, the gate G1 may be linearly moved in the vertical direction in place of being pivoted, or the arrangement described above may be applied to the gate G2 on the side of the process chamber.

Figure 14A:
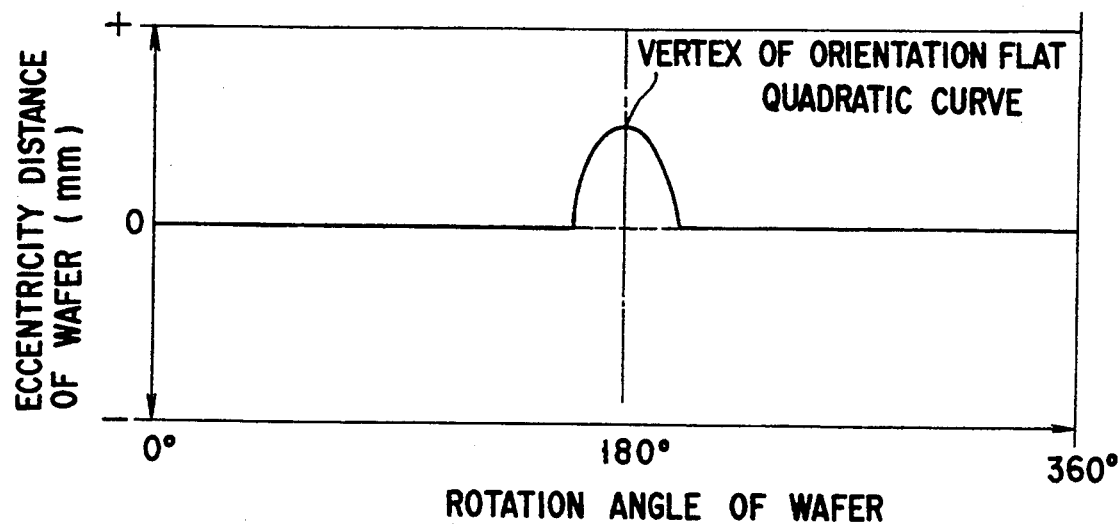
FIGS. 14A and 14B are views for explaining detection of a positional error of the center of a wafer.
Figure 14B:
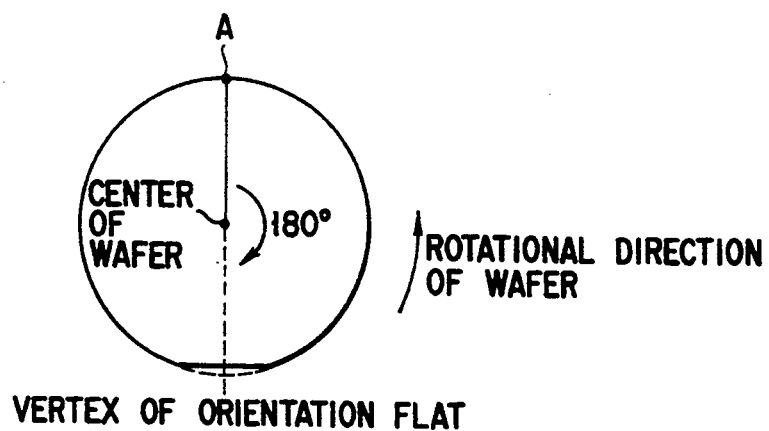
Figure 15A:
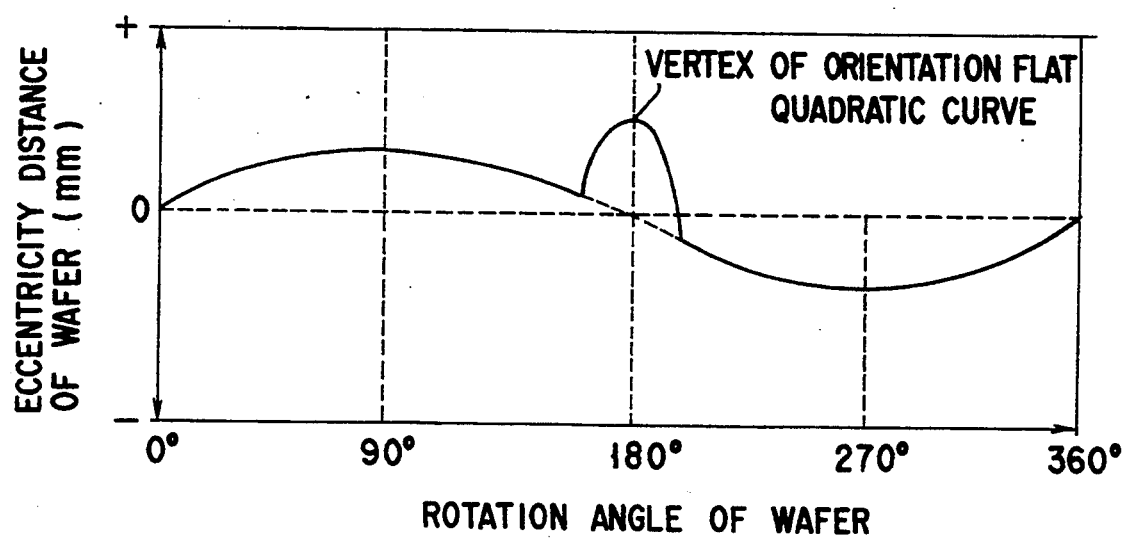
FIGS. 15A and 15B are views for explaining detection of another positional error of the center of a wafer.
Figure 15B:
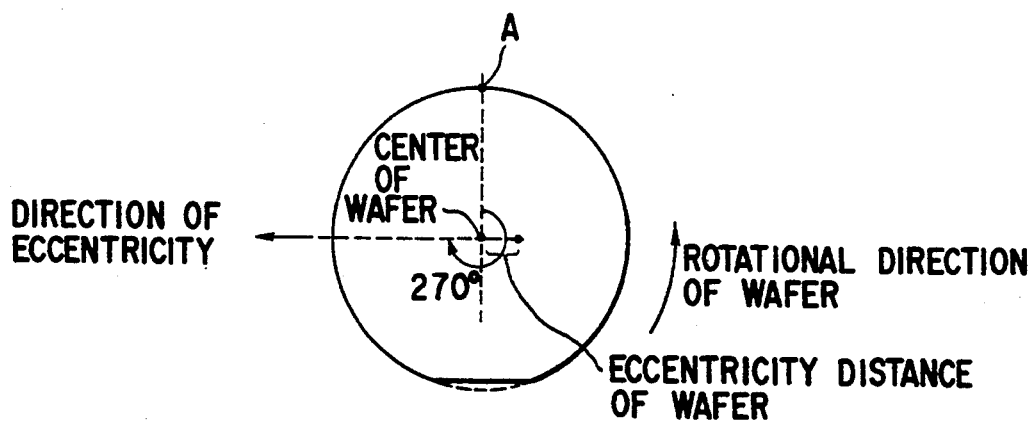

Actual detection data of the positional error of the center of a wafer will now be described. FIG. 14A shows sampling data of a wafer having no eccentricity (error) obtained when detection is started from a point A shown in FIG. 14A by rotating the wafer by one turn. In contrast to this, FIG. 15A shows sampling data of a wafer having eccentricity in the direction of 270°.

Detection of the positional error of the wafer is not limited to the method described in this embodiment, and, e.g., light reflection by the periphery of the wafer may be utilized for this detection.

The present invention is not limited to wafer transfer between atmospheres having different pressures but can be similarly applied to wafer transfer between atmospheres having different types of gases.

In the present invention, the arrangement in the load-lock chamber 4 shown in FIG. 3 can be provided outside the load-lock unit and can be used as a wafer position detecting unit.

As has been described above, according to the present invention, since the positional error of the wafer is detected in the load-lock unit, conventional handling of temporarily placing the wafer on the aligning unit can be eliminated. As a result, damage to the wafer and particles of dust attached to the wafer can be decreased, thus increasing the yield. In addition, the time required for loading can be shortened. As evacuation of the load-lock unit is performed while a plurality of wafers are stored in the load-lock unit, the time required for evacuation of the load-lock can be shortened compared to a single wafer type load-lock unit considering the entire processing. Thus, the throughput can be increased, and since the aligning unit can be eliminated, the size of the entire system can be reduced. Furthermore, since the positional error is detected on the basis of data obtained by rotation of the wafer, a large-size system such as a TV camera need not be used, thus suppressing an increase in size of the load-lock unit.

In particular, when the positional error of the wafer detected in the load-lock unit is corrected by the transfer mechanism disposed in the process chamber in, e.g., a vacuum atmosphere, transfer and correction of the positional error can be simultaneously performed, thus further increasing the throughput. Simultaneously, since the positional error is corrected at the final position of the wafer, e.g., at a position close to the turntable described above, high-precision alignment can be performed.

Furthermore, since a positional error can be detected while a plurality of wafers are stored in the carrier, the number of transfer steps can be decreased as compared with a case in which the wafers are transferred temporarily to a separate aligning unit from the carrier, resulting in a decrease in damage to the wafer and an increase in throughput.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A transfer system comprising a load-lock unit which is disposed between first and second atmospheres, for storing a wafer transferred from the first atmosphere, and which is blocked off from the first atmosphere, thereafter being set in an atmosphere substantially similar to the second atmosphere, and opened so as to communicate with the second atmosphere in order to transfer the wafer to the second atmosphere, a transfer device for transferring the wafer in said load-lock unit to a predetermined position in the second atmosphere, and a control mechanism for controlling said transfer device, said load-lock unit comprising:
    a load-lock chamber having a wall and a floor,
    a storing device, disposed in said load-lock chamber, for storing a plurality of wafers vertically with a gap between each wafer,
    a holding mechanism for holding one of the plurality of wafers stored in said storing device,
    a rotating mechanism for rotating said one of said wafers held by said holding mechanism, and an error detecting device for detecting a positional error of a center of the wafer and an orientation error of the wafer based on data obtained by radiating light on the wafer which is rotating, and
    a control mechanism for controlling said transfer device so that the wafer is disposed at the predetermined position in the second atmosphere after the positional error of the center thereof and the orientation error thereof are corrected based on data from said error detecting device.

2. A system according to claim 1, wherein said transfer device includes a mechanism for correcting the positional error of the center of the wafer and the orientation error of the wafer, and wherein the positional error of the center of the wafer and the orientation error of the wafer are corrected during transfer of the wafer by said transfer device.

3. A system according to claim 1, which comprises a mechanism for correcting the positional error of the center of the wafer and the orientation error of the wafer is arranged in said load-lock chamber, and wherein said error correcting mechanism includes a mechanism for correcting the positional error of the center of the wafer and the orientation error of the wafer within said load-lock chamber.

4. A system according to claim 1, wherein the rotating mechanism includes a device for correcting the orientation error of the wafer.

5. A system according to claim 1, wherein the orientation error of the wafer is corrected during evacuation of said load-lock chamber.

6. A system according to claim 1, which comprises an operating device wherein said error detecting device comprises an optical unit for generating optical data obtained by radiating light on the wafer which rotates, and wherein said operations device is connected to said optical unit.

7. A system according to claim 6, wherein said optical unit comprises a light-emitting section for emitting a laser beam, and a light-receiving section for receiving the laser beam from the rotating wafer and converting the laser beam to an electrical signal.

8. A system according to claim 7, wherein said light-receiving section receives the laser beam passing through a peripheral portion of the wafer and detects an amount of the received laser beam.

9. A system according to claim 7, wherein said light-receiving section receives the laser beam reflected by a peripheral portion of the wafer and detects an amount of the received laser beam.

10. A system according to claim 1, wherein said rotating mechanism rotates said holding mechanism.

11. A system according to claim 1, wherein said load-lock chamber comprises a wafer inlet port having an open surface inclined obliquely downward, and a pivotal member which pivots about a horizontal axis in order to open and close the wafer inlet port.

12. A system according to claim 11, wherein the positional error of a center portion of the wafer and the orientation error of the wafer are corrected during the transfer of the wafer.

13. A transfer system comprising a first load-lock unit which is disposed between first and second atmospheres, for storing a wafer transferred from the first atmosphere, and which is blocked off from the first atmosphere, thereafter being set in an atmosphere substantially similar to the second atmosphere, and opened so as to communicate with the second atmosphere in order to transfer the wafer to the second atmosphere, a second load-lock unit similar in structure to said first load-lock unit, a transfer mechanism for transferring the wafer in said first and second load-lock units to a predetermined position in the second atmosphere, and a control mechanism for controlling said transfer mechanism, each of said first and second load-lock units comprising:
    a load-lock chamber having a wall and floor;
    a storing device, disposed in said load-lock chamber, for storing a plurality of wafers vertically with a gap between each of said wafers,
    a holding mechanism for holding one of the plurality of wafers stored in said storing device,
    a rotating mechanism for rotating the wafer held by said holding mechanism,
    an error detecting device for detecting a positional error of a center of the wafer and an orientation error of the wafer based on data obtained by radiating light on the wafer which is rotating, wherein said control mechanism for controlling said transfer mechanism controls said transfer mechanism so that the wafer is disposed at the predetermined position in the second atmosphere after the positional error of the center thereof and the orientation error thereof are corrected based on data from said error detecting device.

14. A load-lock unit which is disposed between first and second atmospheres, for storing a wafer transferred from the first atmosphere, and which is blocked off from the first atmosphere, thereafter being set in an atmosphere at least substantially similar to the second atmosphere, and opened so as to communicate with the second atmosphere in order to transfer the wafer to the second atmosphere, said wafer having a shape bounded by an at least partially circular segment, said unit comprising:

a load-lock chamber having a wall and a floor;

a storing device, disposed in said load-lock chamber, for storing a plurality of wafers vertically with a gap between each of said wafers;

a holding and rotating mechanism for holding a lowest wafer of the plurality of wafers stored in said storing device and for rotating the wafer; and an error detecting device for detecting a positional error of a center of the wafer and an orientation error of the wafer based on data obtained by radiating light on the wafer when the wafer is rotating, said storing device including a plurality of receiving members, vertically arranged, at a plurality of levels, wherein each of said receiving members comprise first and second supporting sections for supporting both sides of the wafer therebetween.

15. A unit according to claim 14, which comprises an elevating mechanism for vertically moving said storing device.

16. A unit according to claim 15, which comprises a control mechanism for controlling a stop position of said storing device which is vertically moveable.

17. A unit according to claim 14, wherein said error detecting device comprises an optical unit for generating an electrical signal based on optical data obtained by radiating light on the wafer which rotates, and an operating device, connected to said optical unit, for calculating the electrical signal.

18. A unit according to claim 17, wherein said light-receiving section receives a laser beam passing through a peripheral portion of the wafer and detects an amount of laser beam received.

19. A unit according to claim 17, wherein said light-receiving section receives a laser beam reflected by a peripheral portion of the wafer and detects an amount of laser beam received.

20. A unit according to claim 17, wherein said optical unit comprises a light-emitting section for emitting a laser beam, and a light-receiving section for receiving the laser beam from the rotating wafer and converting the laser beam to an electrical signal.

21. A unit according to claim 14, wherein said rotating mechanism rotates said holding mechanism.

22. A unit according to claim 14, wherein said load-lock chamber comprises a wafer inlet port having an open surface inclined obliquely downward, and a pivotal member which pivots about a horizontal axis in order to open and close the wafer inlet port.

23. A unit according to claim 14, wherein said first supporting section has an arched receiving plate member for supporting a lower surface of a first side of a peripheral portion of the wafer, said second supporting section has a tongue-shaped receiving plate section for supporting a lower surface of a second side of the peripheral portion of the wafer opposite said first side, and said receiving members further comprise a coupling mechanism for coupling said first and second receiving sections.

* * * * *